United States Patent
Powell

(10) Patent No.: US 8,988,168 B2
(45) Date of Patent: Mar. 24, 2015

(54) GROUND NOISE INDUCTIVE FILTER

(71) Applicant: Garth Judson Powell, Irvine, CA (US)

(72) Inventor: Garth Judson Powell, Irvine, CA (US)

(73) Assignee: The Quest Group, Irvine, CA (US)

( * ) Notice: Subject to any disclaimer, the term of this patent is extended or adjusted under 35 U.S.C. 154(b) by 88 days.

(21) Appl. No.: 14/010,358

(22) Filed: Aug. 26, 2013

(65) Prior Publication Data

US 2015/0035620 A1 Feb. 5, 2015

Related U.S. Application Data

(60) Provisional application No. 61/861,930, filed on Aug. 2, 2013.

(51) Int. Cl.
*H03H 7/00* (2006.01)
*H03H 7/01* (2006.01)

(52) U.S. Cl.
CPC .................................. *H03H 7/0161* (2013.01)
USPC ........................................... 333/181; 333/182

(58) Field of Classification Search
USPC .......................... 333/181, 182, 165, 166, 172
See application file for complete search history.

(56) References Cited

U.S. PATENT DOCUMENTS 4,293,798 A * 10/1981 Gerry ........................ 315/209 R

* cited by examiner

*Primary Examiner* — An Luu
(74) *Attorney, Agent, or Firm* — McDermott Will & Emery LLP

(57) ABSTRACT

An alternating current (AC) power device includes an AC circuit having input nodes, output nodes and a ground node. The AC circuit is configured to receive an input electrical signal at the input nodes and generate an output electrical signal at the output nodes. The AC power device also includes an inductor coupled to the ground node of the AC circuit. The ground node is configured to be coupled to a ground plane at a ground potential. The AC circuit is configured to be coupled to a load at the output nodes. The inductor is configured to be connected in series between the ground node of the AC circuit and the load to attenuate radio frequency components present at the ground node.

20 Claims, 4 Drawing Sheets

GROUND NOISE INDUCTIVE FILTER

CROSS-REFERENCE TO RELATED APPLICATIONS

The present application claims the benefit of U.S. Provisional Patent Application Ser. No. 61/861,930, titled "GROUND NOISE INDUCTIVE FILTER," filed on Aug. 2, 2013, which is hereby incorporated by reference in its entirety for all purposes.

FIELD

The present disclosure relates to electrical power systems, and more particularly to ground noise inductive filtering in electrical power delivery systems.

BACKGROUND

Radio frequency (RF) noise can be found in electronic circuitry that experiences electromagnetic induction or radiation from an external source. The RF noise can inhabit a ground reference of an alternating current (AC) circuit. In this respect, the RF noise present in the ground reference can impact a load receiving an output electrical signal from the AC circuit. In turn, the RF noise can modulate the ground return path of the load, thus impacting performance and resolution of the load including increases in signal distortion.

SUMMARY

According to some implementations, an alternating current (AC) power device includes an AC circuit having input nodes, output nodes and a ground node. The AC circuit is configured to receive an input electrical signal at the input nodes and generate an output electrical signal at the output nodes. The AC power device also includes an inductor coupled to the ground node of the AC circuit. The ground node is configured to be coupled to a ground plane at a ground potential. The AC circuit is configured to be coupled to a load at the output nodes. The inductor is configured to be connected in series between the ground node of the AC circuit and the load to attenuate radio frequency components present at the ground node.

In some aspects, a power line assembly is provided. The power line assembly includes conductors configured to carry a voltage varying electrical signal from a power source to a load. The conductors may respectively include a core and an insulating layer enclosing the core. The conductors may include a grounding conductor that is configured to couple to a ground node to provide grounding between the power source and the load. The insulating layer of the grounding conductor may have an inductance that is configured to attenuate radio frequency components present at the ground node. In this respect, the inductance of the insulating layer is configured to provide a low impedance low pass filter for the grounding conductor.

Additional features and advantages of the subject technology will be set forth in the description below, and in part will be apparent from the description, or may be learned by practice of the subject technology. The advantages of the subject technology will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without some of these specific details. In certain instances, structures and components are shown in block diagram form in order to avoid obscuring the concepts of the subject technology.

In view of the impact RF noise can have on the ground reference in AC circuits, the subject disclosure provides ground noise suppression by inductive filtering. The inductive filter can be implemented in series with the ground reference to attenuate RF components from the ground reference to prevent RF noise from impacting a ground return path in load devices. The dissipation of ground noise at a power source can improve the performance of audio, video and data transmission circuitry present at a load since the risk of RF noise modulating the ground return of the load is significantly reduced.

Figure 1:
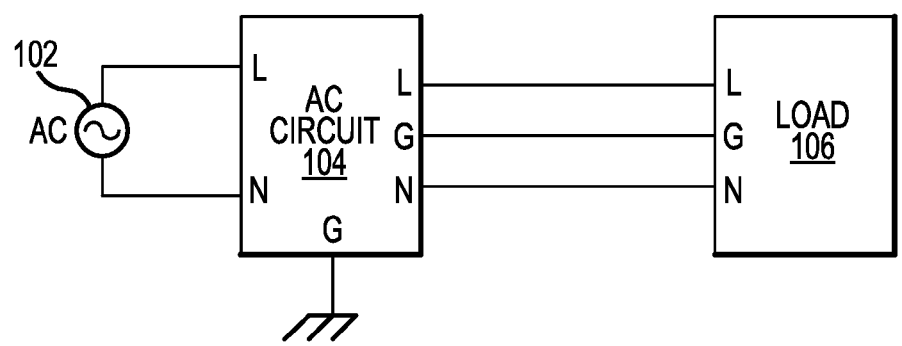
FIG. 1 is a block diagram illustrating a power system, in accordance with various aspects of the subject technology.

FIG. 1 is a block diagram illustrating a power system 100, in accordance with various aspects of the subject disclosure. Power system 100 includes alternating current (AC) source 102, AC circuit 104 and load 106. As shown in FIG. 1, AC circuit 104 supplies an output electrical signal to load 106 based on an input electrical signal from AC source 102.

In some aspects, AC circuit 104 is configured to provide (or deliver) AC power to load 106. AC circuit 104 may amplify the input electrical signal from AC source 102 to supply the output electrical signal to load 106. In this regard, the output electrical signal may be an amplified version of the input electrical signal having a higher power value. AC circuit 104 also may convert the input electrical signal having a first voltage into the output electrical signal having a second voltage. In this regard, the input and output electrical signals may have different voltages but provide the same amount of power to load 106.

Non-limiting examples of an AC circuit include, but are not limited to, a single or multiple tap outlet device, a power filter, a power conditioner, a power regenerator, a power surge suppressor, a power distributor, an isolation transformer, a center tapped power transformer, an uninterruptible power supply, a voltage regulator, an electronic power supply (passive or active), a bipolar power supply, a power cable or a wiring device.

As shown in FIG. 1, AC circuit 104 includes a line lead (L), a neutral lead (N), and a ground lead (G). The line lead is configured to carry the AC signal from AC source 102, and can sometimes be referred to as a "hot" conductor. The neutral lead is configured to also carry the AC signal and may be coupled to a ground plane at AC circuit 104 to provide a ground return path at AC circuit 104. The return path may avoid electrical shock since the return path may serve as a low impedance path to the ground plane.

In some aspects, the ground lead may be directly coupled to the ground plane having an earth ground reference. In one or more implementations, the ground lead may be coupled to a chassis ground having a potential that is greater than or equal to the earth ground reference. The ground lead may be configured not to carry any current (including the AC signal), but may carry current associated with the AC signal if the line lead and neutral lead became shorted. In this respect, the path to ground can protect components inside AC circuit 104 from electrical shock or a power surge. The ground lead also may protect a user from electrical shock when in contact with AC circuit 104 since the ground lead can provide a low impedance path to ground that is separate from the conducting path carrying the AC signal.

Load 106 may include audio, video, or data transmission circuitry. In some aspects, load 106 represents high fidelity audio and video equipment that may require a electrical signal from AC circuit 104 having a ground signal with minimal RF noise. By way of illustration, audio, video or data transmission signals may be communicated between high fidelity audio equipment, video components and data systems interconnected in a residential or commercial entertainment system as part of load 106. The output electrical signal may be utilized to supply power to the high fidelity audio equipment, video components or data systems. In this respect, any RF noise present in the ground signal portion of the output electrical signal can impact the load by modulating the ground return of the high fidelity audio equipment, which in turn impacts the performance of the equipment. As such, suppressing RF noise from reaching the load via the output electrical signal is desirable.

As briefly discussed above, RF noise can inhabit a ground reference of AC circuit 104 supplying electrical signals to load 106, which in turn can impact the ground return path of load 106. If the RF noise modulates the ground return path of load 106, the performance of load 106 can be adversely impacted. The RF noise may derive from a ground lead, wire, or terminal within power device 100 or from an external source. In this respect, the subject disclosure provides AC circuit 104 for reducing RF noise and other distortions that can be present on a ground signal portion that travels into load 106 from a ground plane at the ground potential. By minimizing the RF noise that can inhabit the ground signal portion that is output from AC circuit 104, there is a lower likelihood that the RF noise can modulate the ground return path at load 106. This noise suppression provides for improved performance, reduced distortion, and increased resolution from these circuits and the electronic components that contain them.

Figure 2A:
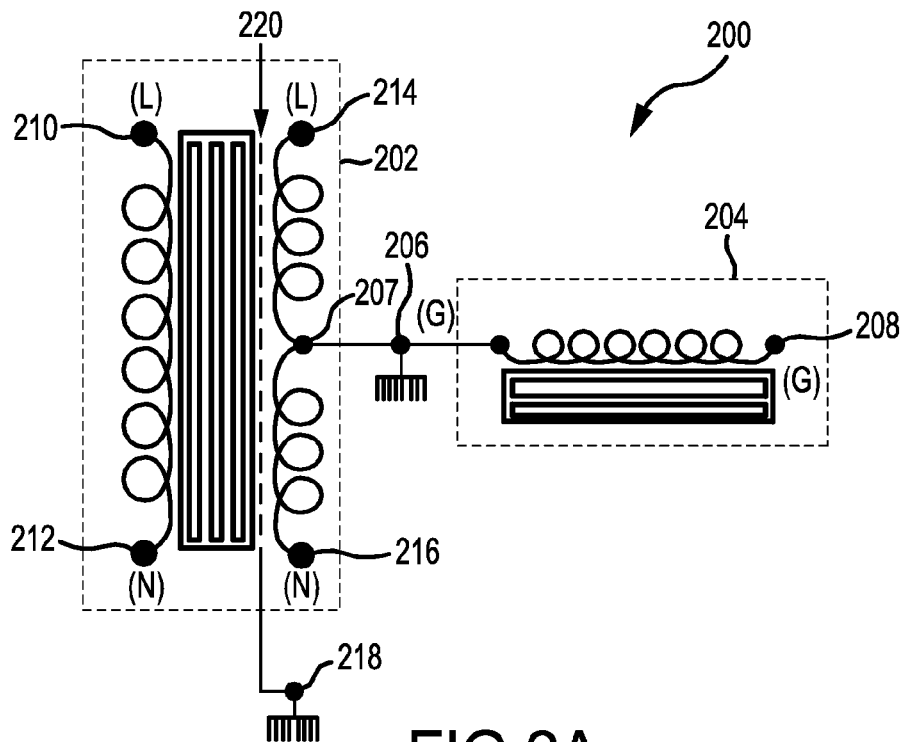
FIGS. 2A-2B are circuit diagrams illustrating examples of a power device, in accordance with various aspects of the subject technology.

FIG. 2A is a block diagram illustrating an example of the AC Circuit as included in power system 100 of FIG. 1, in accordance with various aspects of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

AC circuit 200 includes transformer 202 and inductor 204. AC circuit 200 also includes ground node (G) 206, center tap node 207, ground output node (G) 208, line input node (L) 210, neutral input node (N) 212, line output node (L) 214, neutral output node (N) 216, chassis ground 218 and conductive layer 220.

AC circuit 200 may be operable to remove RF noise and distortion from a ground signal portion of the output electrical signal used to supply power to electronic components of a load (e.g., load 106 of FIG. 1) requiring AC voltage. In this respect, inductor 204 may provide a low-impedance low-pass filter for ground signals traveling from ground node 206 to ground output node 208.

As shown in FIG. 2A, line input node 210 and neutral input node 212 are coupled to a primary winding of transformer 202, and line output node 214 and neutral output node 216 are coupled to a secondary winding of transformer 202. Ground node 206 is coupled to a location on the secondary winding that is centered between line output node 214 and neutral output node 216. Inductor 204 is connected in series with ground node 206 and coupled to ground output node 208.

In some aspects, line input node 210 and neutral input node 212 may receive the same input electrical signal (e.g., same voltage amplitude). Alternatively, line input node 210 and neutral input node 212 may receive different input electrical signals. Line output node 214 and neutral output node 216 can be configured to supply output electrical signals having different voltages. In some aspects, line output node 214 and neutral output node 216 can be configured to supply output electrical signals having a same voltage.

Transformer 202 may include a ferromagnetic core or a non-ferromagnetic core. As such, transformer 202 may be configured to convert the input electrical signal having a first voltage into the output electrical signal having a second voltage. By way of illustration, transformer 202 may convert the input electrical signal, via line input node 210, having a voltage in a range of 100 to 480 V (e.g., 200 V AC) into the output electrical signal, via line output node 214, having a voltage in a range of 1 to 600 V (e.g., 400 V AC). As used herein, the term "range" includes non-limiting examples of a range of numerical values available to represent AC voltages, and are not intended to limit the scope of the subject disclosure.

In addition, transformer 202 can receive the input electrical signal, via neutral input node 212, at zero potential (e.g., 0 V AC) and convert the input electrical signal into an output electrical signal, via neutral output node 216, having an AC voltage in a range of 1 to 600 V (e.g., 400 V AC).

The center tap node 207 is located on the secondary winding that is centered between line output node 214 and neutral output node 216. Here, center tap node 207 is coupled to ground node 206. Inductor 204 may be connected to center tap node 207 of transformer 202 via ground node 206. Because center tap node 207 can be connected (or tied) to ground, transformer 202 may be configured to supply symmetrical power supplies at line output node 214 and neutral output node 216. In some aspects, center tap node 207 may sometimes be referred to as a virtual AC ground.

In some aspects, transformer 202 includes conductive layer 220 located between the primary and secondary windings. Conductive layer 220 may be a faraday shield (or screen). Here, conductive layer 220 is coupled to chassis ground node 218 that may be at ground potential or at a potential that is greater than the ground potential. Conductive layer 220 may provide additional attenuation of radio frequency components such that the RF noise is further reduced at ground output node 208.

As shown in FIG. 2A, inductor 204 is connected in series between ground node 206 and ground output node 208. Inductor 204 may be configured as a low-impedance low-pass filter in series with ground node 206. In this respect, inductor 204 can attenuate radio frequency components present at ground node 206 such that the RF noise can be suppressed at ground output node 208. Providing the output electrical signal having the ground signal portion substantially free from RF noise can help improve the performance of a load (e.g., load 106 of FIG. 1).

Inductor 204 may be formed by having several windings wound over a core. The core, for example, may be manufactured from a ferrous material including metal alloys in any physical configuration. In this respect, inductor 204 may have an inductance in a range of 20 micro-Henries (μH) to 10 Henries (H). In some aspects, inductor 204 may be wound over a toroid or a bobbin.

Inductor 204 may be implemented as a choke. The choke may be connected in series between a source and a load. Here, the choke can be implemented between ground node 206 and ground output node 208. By way of illustration, inductor 204 may be configured to limit the amount of AC current that flows through inductor 204 as the inductance increases.

Ground node 206 is configured to couple to a ground plane at ground potential. Ground node 206 may be configured to float from an earth ground plane. The ground earth plane may be at zero potential. In some aspects, ground node 206 is configured to float from a chassis ground. The chassis ground may be a ground reference that is floating at a potential other than the earth ground plane. In some aspects, ground node 206 may be an AC virtual ground.

Ground output node 208 is coupled to ground node 206 via inductor 204 and may be configured to provide a ground signal portion of the output electrical signal at the ground potential. Sensitive electrical equipment that requires AC voltage (e.g., high-fidelity audio equipment), for example, may receive the ground signal portion from ground output node 208. In this respect, the equipment receiving the ground signal portion may be impacted if the ground signal portion contains RF noise. As such, inductor 204, serving as a low-pass filter, can attenuate the RF noise such that ground output node 208 can supply the ground signal portion substantially free from RF noise.

In one or more implementations, AC circuit 200 may be utilized by either a single or a multi-phase AC circuit so long as ground is present. In some implementations, ferrite beads and ferrite clamps may be coupled with AC circuit 200 to provide noise dissipation.

Figure 2B:
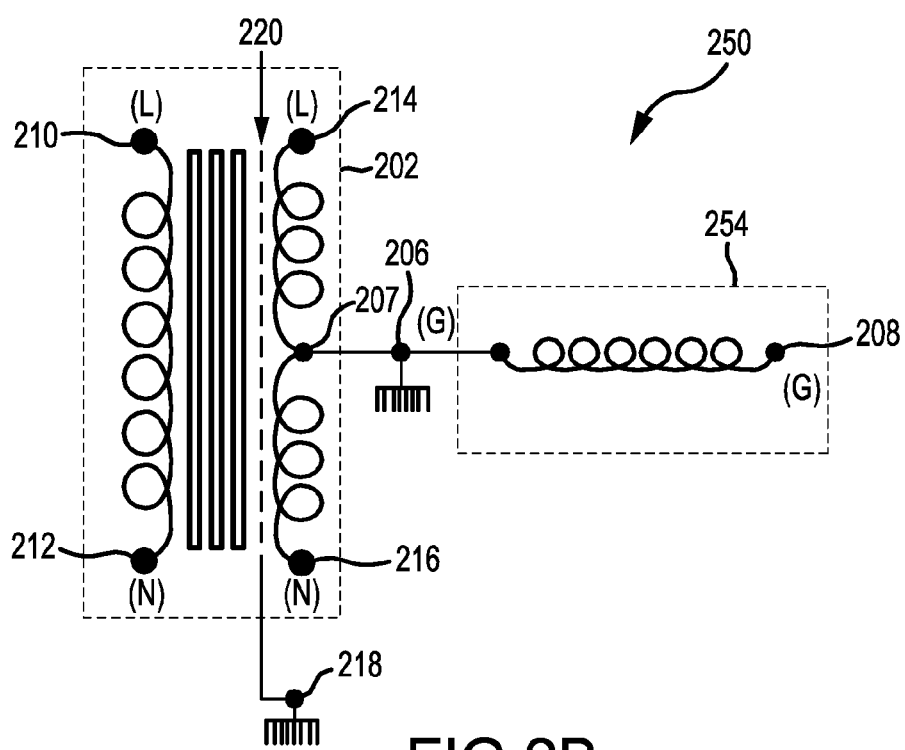

FIG. 2B is a block diagram illustrating an example of the AC Circuit included in power system 100 of FIG. 1, in accordance with various aspects of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

AC circuit 250 includes transformer 202 and inductor 254. AC circuit 250 also includes ground node 206, ground output node 208, line input node 210, neutral input node 212, line output node 214, neutral output node 216, chassis ground 218 and conductive layer 220.

As shown in FIG. 2B, AC circuit 250 is substantially similar to AC circuit 200 as described above, therefore, only differences will be described in further detail. Here, inductor 254 may be configured as an air core inductor rather than an inductor having several windings over a ferromagnetic core. That is, inductor 254 may include several windings over a non-ferromagnetic core. In this regard, inductor 254 can have an inductance in a range of 20 μH to 50 mH.

By way of illustration, transformer 202 may receive an input electrical signal, via line input node 210, having a voltage in a range of 100 to 480 V (e.g., 200 V AC) and convert the input electrical signal into an output electrical signal, via line output node 214, having a voltage in a range of 1 to 600 V (e.g., 400 VAC).

In addition, transformer 202 can receive an input electrical signal, via neutral input node 212, at zero potential (e.g., 0 V AC) and convert the input electrical signal into an output electrical signal, via neutral output node 216, having an AC voltage in a range of 1 to 600 V (e.g., 400 V AC).

As shown in FIG. 2B, inductor 254 is connected in series between ground node 206 and ground output node 208. As such, inductor 254 is configured as a low-impedance low-pass filter in series with ground node 206. In this respect, inductor 254 can attenuate radio frequency components present at ground node 206. As such, AC circuit 250 can provide the ground signal portion of the output electrical signal with reduced RF noise, thus improving the performance of load 106 including a reduction in signal distortion.

Figure 3A:
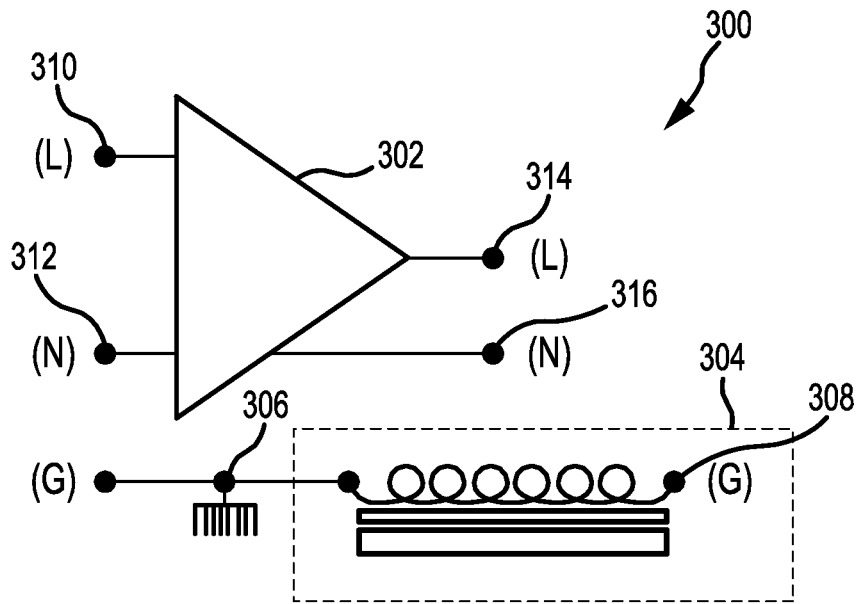
FIGS. 3A-3B are circuit diagrams illustrating examples of a power device, in accordance with various aspects of the subject technology.

FIG. 3A is a block diagram illustrating an example of the AC circuit included in power system 100 of FIG. 1, in accordance with various aspects of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

AC circuit 300 includes amplifier 302 and inductor 304. AC circuit 300 also includes multiple input nodes (e.g., line input node (L) 310, neutral input node (N) 312) configured to receive an input electrical signal and multiple output nodes (e.g., line output node (L) 314, neutral output node (N) 316) configured to supply an output electrical signal. In this regard, the output electrical signal may be an amplified version of the input electrical signal. In some aspects, the voltage amplitude between line input node 310 and neutral input node 312 may be different. AC circuit 300 also includes ground node (G) 306 and ground output node (G) 308.

Amplifier 302 may be configured to convert the input electrical signal from a first voltage to a second voltage. By way of illustration, amplifier 302 receives the input electrical signal, via line input node 310, having the first voltage in a range of 100 V to 480 V AC (e.g., 300 V AC), and convert the input electrical signal into the output electrical signal having the second voltage in a range of 1 V to 480 V AC (e.g., 400 V AC).

In some aspects, amplifier 302 may receive the input electrical signal at zero potential (e.g., 0 V AC) via neutral input node 312. In this respect, amplifier 302 may convert the input electrical signal at 0 V AC into the output electrical signal, via neutral output node 316, having a voltage in a range of 0 V to 240 V AC (e.g., 200 V AC).

Like AC circuit 200, AC circuit 300 may be configured to dissipate RF noise from the ground signal portion that travels from ground node 306 to ground output node 308. As shown in FIG. 3A, inductor 304 is connected in series between ground node 306 and ground output node 308. Here, inductor 304 is configured as a low-impedance low-pass filter in series with ground node 306. Inductor 304 can attenuate radio frequency components present at ground node 306 such that AC circuit 300 can provide the ground signal portion of the output electrical signal with reduced RF noise, thus improving the performance of a load (e.g., load 106 of FIG. 1) including a reduction in signal distortion.

Inductor 304 may include several windings wound over a core. In some aspects, the core may be manufactured from a ferrous core material or a ferrous metal alloy in any physical configuration. In this respect, inductor 304 may have an inductance in a range of 20 micro-Henries (µH) to 10 Henries (H). In one or more implementations, inductor 304 may be wound over a toroid or a bobbin.

Ground node 306 is configured to couple to a ground plane at ground potential. Ground node 306 may be configured to float from an earth ground plane. The ground earth plane may be at zero potential. In some aspects, ground node 306 is configured to float from a chassis ground. The chassis ground may be a ground reference that is floating at a potential other than the earth ground plane. In one or more implementations, ground node 306 may be an AC virtual ground.

Ground output node 308 is coupled to ground node 306 via inductor 304 and may be configured to provide the ground signal portion of the output electrical signal at the ground potential. High fidelity audio equipment that requires AC voltage, for example, may utilize ground output node 308. This circuit or chassis ground node will have benefitted from the low-pass filter supplied from the AC ground filter originating at ground node 306.

Figure 3B:
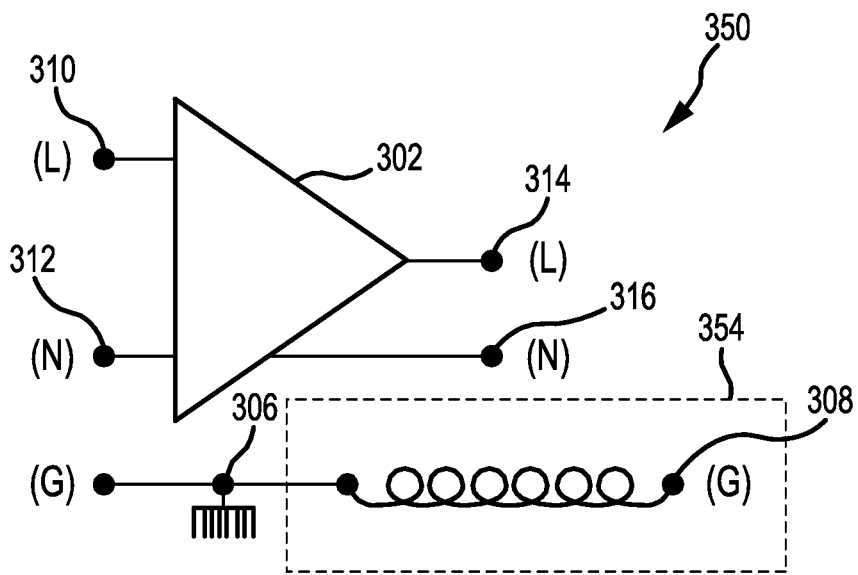

FIG. 3B is a block diagram illustrating an example of the AC circuit included in power system 100 of FIG. 1, in accordance with various aspects of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

AC circuit 350 includes amplifier 302 and inductor 354. AC circuit 350 also includes ground node (G) 306, ground output node (G) 308, line input node (L) 310, neutral input node (N) 312, line output node (L) 314, neutral output node (N) 316, chassis ground 318 and conductive layer 320.

As shown in FIG. 3B, AC circuit 350 is substantially similar to AC circuit 300 as described above, therefore, only differences will be described in further detail. Here, inductor 354 may be configured as an air core inductor rather than an inductor having several windings wound over a ferromagnetic core. That is, inductor 354 may include several windings wound over a non-ferromagnetic core. In this regard, inductor 354 can have an inductance in a range of 20 µH to 50 mH.

Amplifier 302 may receive a first input electrical signal, via line input node 310, having a voltage in a range of 100 to 480 V (e.g., 300 V AC) and convert the input electrical signal into an output electrical signal, via line output node 314, having a voltage in a range of 1 to 480 V (e.g., 400 V AC).

In addition, amplifier 302 can convert a second input electrical signal, via neutral input node 312, at zero potential (e.g., 0 V AC) into a second output electrical signal, via neutral output node 316, having an AC voltage in a range of 0 V to 240 V (e.g., 200 V AC).

As shown in FIG. 3B, inductor 354 is connected in series between ground node 306 and ground output node 308. Inductor 354 may include several coil windings wound over a non-ferromagnetic core. Further, inductor 354 is configured as a low-impedance low-pass filter in series with ground node 306. In this respect, inductor 354 can attenuate radio frequency components present at ground node 306. As a result, AC circuit 350 can remove RF noise from the ground signal portion of the output electrical signal (e.g., less signal distortion), thus improving the performance of a load (e.g., load 106 of FIG. 1).

Figure 4:
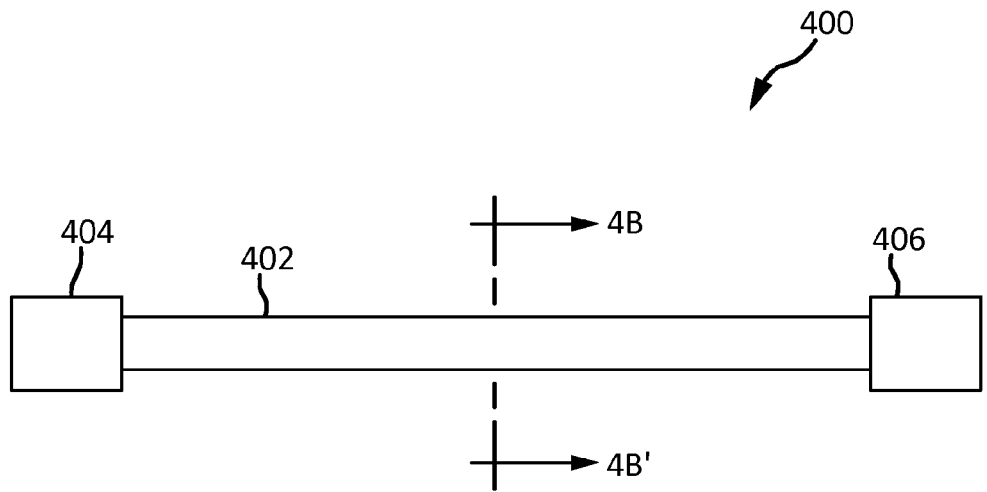
FIGS. 4A-4B is a cross-section illustrating an example of a power line assembly, in accordance with various aspects of the subject technology.
Figure 4B:
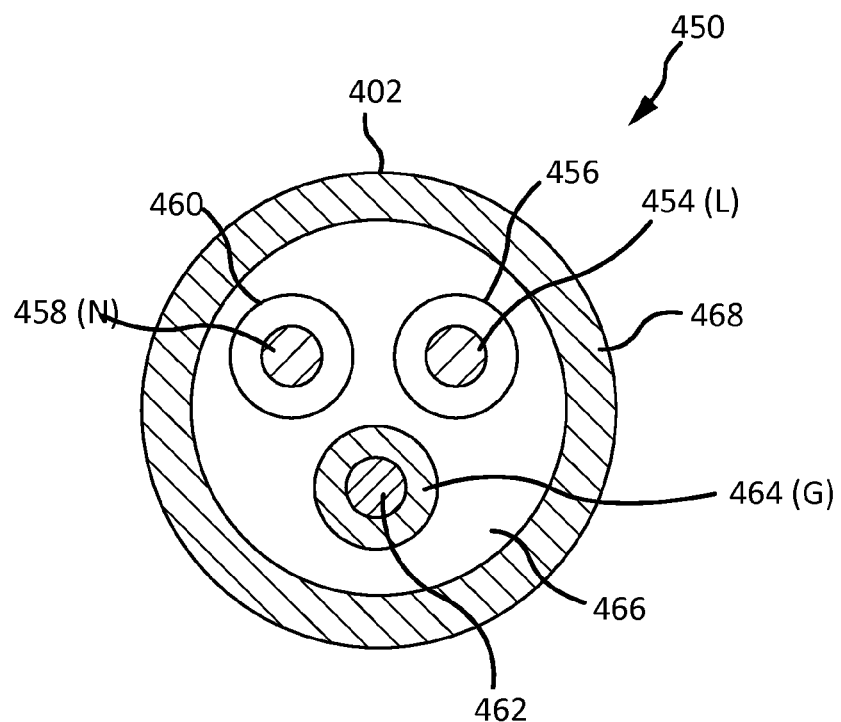

FIGS. 4A-4B illustrate an example of a power line assembly, in accordance with various aspects of the subject technology. FIG. 4A shows power line assembly 400 for transporting output electrical signals between a source and a load, and FIG. 4B shows cross-section 450 along the 4B-4B' axis of the same.

Referring to FIG. 4A, power line assembly 400 may be designed to limit undesired inductive and capacitive effects, and also limit external magnetic interference. As shown in FIG. 4A, power line assembly 400 includes cable 402 and terminations 404 and 406 at each end, which commonly function as mating fasteners to join power line assembly 400 with various electrical devices or other cables. Terminations 404 and 406 can include, among other things, plugs, jacks, connectors, adapters, and similar physical items.

Referring to FIG. 4B, cross-section 450 shows cable 402, line lead (L) 454, line insulation 456, neutral lead (N) 458, neutral insulation 460, ground lead (G) 462, ground insulation 464, cable insulation 466 and cable jacket 468. Line lead 454 and line insulation 456 may collectively be referred to as a line conductor. As such, the line conductor includes a core (e.g., line lead 454) and an insulating layer (e.g., line insulation 456) that encloses the core. Similarly, neutral lead 458 and ground lead 462 may sometimes be referred to as the core of a respective conductor, while neutral insulation 460 and ground insulation 464 can be referred to as the insulating layer that encloses the core of the respective conductor.

Line lead 454 and neutral lead 458 may be configured to carry a voltage varying electrical signal (e.g., AC signal) from AC circuit 104 (FIG. 1) to load 106 (FIG. 1). In some aspects, line lead 454 and neutral lead 458 may receive the same input node AC signal (e.g., same voltage amplitude). Alternatively, line lead 454 and neutral lead 458 may receive respective input electrical signals having different voltages.

Ground lead 462 may be configured to couple to a ground node to provide a ground signal portion of the voltage varying electrical signal from AC circuit 104 to load 106. As discussed above, ground lead 462 may be enclosed by ground insulation 464, which can provide an inductance that attenuates radio frequency components present at the ground node. In this respect, ground insulation 464 may be configured to provide a low-impedance low-pass filter in series with the ground node. As such, the inductance formed within ground insulation 464 can cause RF noise present along ground lead 462 to be suppressed (or at least removed) before reaching the coupling at a load (e.g., load 106 of FIG. 1).

Ground insulation 464 may be formed of ferrite, sendust, powdered iron, or any other powdered metal alloy infused, mixed into, or clad to the polymer or rubber insulation of ground lead 462 in an AC component or an AC cable, wire or connector. As such, ground insulation 464 may include a polymer or a rubber compound. In some aspects, ground insulation 464 may include a powdered metal alloy, in which the polymer or the rubber compound is combined with the powered metal alloy. In one or more implementations, ground insulation 464 may include a ferrous material including a metal alloy.

When the inductance is derived within an AC cable (e.g., cable 402) or wire as a portion of a ground lead insulation (e.g., ground insulation 464), the inductance may be in a range of 2 µH to 10 mH. Because power line assembly 400 can be designed with a relatively short length, and the mixture of polymer and ferrous material can have a low magnetic strength, the ground lead insulation inductance can be as low as 2 µH, while relatively long lengths of power line assembly 400 can provide a maximum inductance of 10 mH.

Cable insulation 466 may be disposed within cable 402 and enclose line lead 454, line insulation 456, neutral lead 458, neutral insulation 460, ground lead 462 and ground insulation 464. Cable jacket 468 may be located around the entire power line assembly 400 including cable insulation 466 added for strength, integrity, and overall protection of the components inside cable jacket 468.

To prevent the formation of possible ground loops (e.g., a voltage differential to a ground reference of multiple AC power devices), the inductors shown in FIGS. 2A-4B may be configured to provide a direct current (DC) resistance that is less than or equal to 1 ohm. For example, the relatively low resistance contributed by inductor 204 (FIG. 2A) can reduce the likelihood of a possible voltage differential existing between ground node 206 (FIG. 2A) and ground output node 208 (FIG. 2A). By maintaining the series resistance (or contributing resistance) less than 1.0 ohm DC resistance, the devices shown in FIGS. 2A-4B can stay within a recommended safety range allowed by electrical codes and standards agencies such as Underwriters Laboratory (UL), International Electrotechnical Commission (IEC), Canadian Standards Association (CSA), C-Tick, and Product Safety Engineering (PSE).

The previous description is provided to enable any person skilled in the art to practice the various aspects described herein. Various modifications to these aspects will be readily apparent to those skilled in the art, and the generic principles defined herein is applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code A phrase such as an "aspect" does not imply that such aspect is essential to the subject disclosure or that such aspect applies to all configurations of the subject disclosure. A disclosure relating to an aspect may apply to all configurations, or one or more configurations. A phrase such as an aspect may refer to one or more aspects and vice versa. A phrase such as a "configuration" does not imply that such configuration is essential to the subject disclosure or that such configuration applies to all configurations of the subject disclosure. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An alternating current (AC) power device, comprising:
  an AC circuit comprising a plurality of input nodes, a plurality of output nodes and a ground node, wherein the AC circuit is configured to receive an input electrical signal at the plurality of input nodes and generate an output electrical signal at the plurality of output nodes; and
  an inductor coupled to the ground node of the AC circuit, wherein the ground node is configured to be coupled to a ground plane at a ground potential,
  wherein the AC circuit is configured to be coupled to a load at the plurality of output nodes, and
  wherein the inductor is configured to be connected in series between the ground node of the AC circuit and the load to attenuate radio frequency components present at the ground node.

2. The power device of claim 1, wherein the plurality of input nodes comprises a line input node and a neutral input node, wherein the plurality of output nodes comprises a line output node and a neutral output node, wherein the line input node and neutral input node are configured to receive the input electrical signal having different voltages and the line output node and neutral output node are configured to supply the output electrical signal having different voltages.

3. The power device of claim 1, wherein the plurality of input nodes comprises a line input node and a neutral input node, wherein the plurality of output nodes comprises a line output node and a neutral output node, wherein the line input node and neutral input node are configured to receive the input electrical signal having a same voltage and the line output node and neutral output node are configured to supply the output electrical signal having a same voltage.

4. The power device of claim 1, wherein the AC circuit is an amplifier configured to amplify the input electrical signal having a first voltage into the output electrical signal having a second voltage.

5. The power device of claim 1, wherein the AC circuit is a transformer configured to convert the input electrical signal having a first voltage into the output electrical signal having a second voltage.

6. The power device of claim 5, wherein the transformer comprises a center tap node that is coupled to the ground node, wherein the inductor is coupled to the center tap node via the ground node.

7. The power device of claim 1, wherein the inductor comprises a plurality of windings wound over a ferromagnetic core.

8. The power device of claim 7, wherein the inductor has an inductance in a range between 20 micro-Henries and 10 Henries.

9. The power device of claim 1, wherein the inductor comprises a plurality of windings wound over a non-ferromagnetic core.

10. The power device of claim 9, wherein the inductor has an inductance in a range between 20 micro-Henries and 50 milli-Henries.

11. The power device of claim 1, wherein the inductor is configured as an air-core inductor.

12. The power device of claim 1, wherein the inductor provides a direct current (DC) resistance that is less than or equal to 1 ohm.

13. The power device of claim 1, wherein the ground node is configured to float from an earth ground plane.

14. The power device of claim 1, wherein the ground node is configured to float from a chassis ground configured at a potential other than at the ground potential.

15. An alternating current (AC) power line assembly comprising:
   a plurality of conductors configured to carry a voltage varying electrical signal from a power source to a load, wherein each of the plurality of conductors comprises:
   a core; and
   an insulating layer enclosing the core,
   wherein the plurality of conductors comprises a grounding conductor that is configured to couple to a ground node to provide grounding between the power source and the load,
   wherein the insulating layer of the grounding conductor has an inductance that is configured to attenuate radio frequency components present at the ground node, and
   wherein the inductance of the insulating layer is configured to provide a low impedance low pass filter for the grounding conductor.

16. The power line assembly of claim 15, wherein the inductance of the grounding conductor is in a range between 2 micro-Henries and 10 milli-Henries.

17. The power line assembly of claim 15, wherein the insulating layer of the grounding conductor comprises a polymer or a rubber compound.

18. The power line assembly of claim 17, wherein the insulating layer of the grounding conductor comprises a powdered metal alloy, wherein the polymer or the rubber compound is combined with the powered metal alloy.

19. The power line assembly of claim 15, wherein the insulating layer of the grounding conductor comprises a ferrous material.

20. The power line assembly of claim 15, wherein the plurality of conductors comprises:
   a line conductor configured to carry the voltage varying electrical signal having a first voltage; and
   a neutral conductor configured to carry the voltage varying electrical signal having a second voltage.

* * * * *